(12) United States Patent
Luo et al.

(10) Patent No.: US 8,658,485 B2
(45) Date of Patent: Feb. 25, 2014

(54) SEMICONDUCTOR DEVICE AND METHOD OF FABRICATING THE SAME

(75) Inventors: Zhijiong Luo, Poughkeepsie, NY (US); Haizhou Yin, Poughkeepsie, NY (US); Huilong Zhu, Poughkeepsie, NY (US)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 130 days.

(21) Appl. No.: 12/937,321

(22) PCT Filed: Jun. 28, 2010

(86) PCT No.: PCT/CN2010/074620
§ 371 (c)(1),
(2), (4) Date: Jul. 7, 2011

(87) PCT Pub. No.: WO2011/063650
PCT Pub. Date: Jun. 3, 2011

(65) Prior Publication Data
US 2011/0260264 A1      Oct. 27, 2011

(30) Foreign Application Priority Data
Nov. 24, 2009   (CN) .......................... 2009 1 0238768

(51) Int. Cl.
*H01L 29/772* (2006.01)
*H01L 21/336* (2006.01)

(52) U.S. Cl.
USPC ........... 438/197; 257/382; 257/384; 257/412; 257/E21.2; 257/E21.438; 257/E21.409; 257/E23.011; 257/E29.242; 438/154; 438/300; 438/630; 438/649; 438/651; 438/664; 438/682

(58) Field of Classification Search
CPC ............... H01L 21/823814; H01L 21/823835; H01L 21/823871; H01L 21/76883; H01L 21/76877; H01L 29/665; H01L 29/6656; H01L 29/4966; H01L 29/66545; H01L 23/485
USPC ............. 257/382, 384, 412, E21.165, E21.2, 257/E21.438, E21.409, E29.242; 438/154, 438/197, 300, 630, 649, 651, 664, 682
See application file for complete search history.

(56) References Cited

U.S. PATENT DOCUMENTS 6,228,722 B1   5/2001   Lu ................................ 438/279
6,242,311 B1   6/2001   Ahn .............................. 438/275

(Continued)

FOREIGN PATENT DOCUMENTS

CN      101093816      12/2007
CN      101295665      10/2008

*Primary Examiner* — Matthew W Such
*Assistant Examiner* — David Spalla
(74) *Attorney, Agent, or Firm* — Westman, Champlin & Koehler, P.A.

(57) ABSTRACT

There is provided a semiconductor device and a method of fabricating the same. The method of fabricating a semiconductor device according to the present invention comprises: forming a transistor structure including a gate, and source and drain regions on a semiconductor substrate; carrying out a first silicidation to form a first metal silicide layer on the source and drain regions; depositing a first dielectric layer on the substrate, the top of the first dielectric layer being flush with the top of the gate region; forming contact holes at the portions corresponding to the source and drain regions in the first dielectric layer; and carrying out a second silicidation to form a second metal silicide at the gate region and in the contact holes, wherein the first metal silicide layer is formed to prevent silicidation from occurring at the source and drain regions during the second silicidation.

8 Claims, 5 Drawing Sheets

(56) References Cited

U.S. PATENT DOCUMENTS

| | | |
|---|---|---|
| 6,376,320 B1 | 4/2002 | Yu ................................ 438/303 |
| 6,838,320 B2 * | 1/2005 | Tokunaga et al. ............. 438/128 |
| 7,122,410 B2 * | 10/2006 | Kammler et al. ............. 438/154 |
| 7,923,838 B2 * | 4/2011 | Lavoie et al. ................. 257/751 |
| 2004/0245581 A1 | 12/2004 | Tsuchiaki ..................... 257/382 |
| 2008/0227278 A1 | 9/2008 | Hase ............................. 438/585 |
| 2011/0115032 A1 * | 5/2011 | Mo et al. ....................... 257/408 |

* cited by examiner

SEMICONDUCTOR DEVICE AND METHOD OF FABRICATING THE SAME

CROSS-REFERENCE TO RELATED APPLICATION

This Application is a Section 371 National Stage Application of International Application No. PCT/CN2010/074620, filed Jun. 28, 2010, not yet published in the international stage, the contents of which are hereby incorporated by reference in their entirety.

FIELD OF INVENTION

The present invention generally relates to the field of semiconductor, and in particular, to a semiconductor device and a method of fabricating the same, and especially, to a transistor structure having metal silicide formed in a gate and source/drain regions and a method of fabricating the same.

DESCRIPTION OF PRIOR ART

Integration density of devices in an integrated circuit is improved with the developing of technology. As a result, the size of individual devices on a wafer is increasingly reduced. In order to avoid increase of parasitic resistances due to the reduced size of devices, the technique of self-aligned silicide is proposed. According to such a technique, a resultant from reaction of metal such as Ti, W or Co with semiconductor such as Si, that is, silicide (or specifically, metal silicide), is formed at source and drain regions formed of a dopant diffusion layer and at a gate formed of polycrystalline silicon. Because the metal silicide is only formed from the metal material in contact with the source/drain regions and the gate, such a technique is termed as "self-aligned" silicidation process. By means of such a metal silicide, the resistivities of the respective regions are reduced.

However, in silicidation, if there is excessive amount of metals, the silicide film at the reaction regions will increase in thickness. Moreover, if the metal diffuses into the active region of the device, then over-silicidation unnecessarily occurs in the junction region. As a result, junction leakage occurs in the gate and/or the diffusion layer of the source/drain regions. That is, the metal silicide formed at the junction region will become a source of leakage current.

On the other hand, it is possible to increase the operation speed of a semiconductor device by reducing the resistance of a gate thereof. Therefore, it is desired that the silicon material in the gate is converted into silicide as much as possible, so as to reduce the resistance thereof. That is to say, usually it is desired to achieve full silicidation in the gate. However, if such full silicidation in the gate is to be achieved by means of the conventional technique where the silicidation is carried out simultaneously at the gate and the source/drain regions, then the metal silicide thicker than necessary is formed at the source/drain regions, resulting in unwanted leakage currents.

Furthermore, according to the conventional process, after a structure formed of a gate and a source/drain is provided on a substrate, a dielectric layer is coated thereon, and then contact holes are formed at the portions corresponding to the gate and source/drain regions. Interconnects are formed by filling metals such as Al or Cu into the contact holes. Since the gate region is generally higher in height than the source/drain regions, the depth of the contact hole corresponding to the gate is different from those of the contact holes corresponding to the source/drain regions. Thus, the etching process to etch the contact holes in the dielectric layer should be controlled separately with respect to the gate and source/drain regions in order to form the contact holes with different depths. This is difficult, especially with the circumstance that the integration density is increasingly improved.

SUMMARY OF THE INVENTION

The present invention is made in view of the above problems. It is an object of the present invention to provide a semiconductor device and a method of fabricating the same so that it is possible to reduce the gate resistance of the semiconductor device without causing an unwanted source of leakage current and that the structure of the semiconductor device facilitates the formation of contact holes in subsequent processes.

According to an aspect of the invention, there is provided a method of fabricating a semiconductor device, comprising: forming a transistor structure including a gate, and source and drain regions on a semiconductor substrate; carrying out a first silicidation to form a first metal silicide layer on the source and drain regions; depositing a first dielectric layer on the substrate, the top of the first dielectric layer being flush with the top of the gate region; forming contact holes at the portions corresponding to the source and drain regions in the first dielectric layer; and carrying out a second silicidation to form a second metal silicide at the gate region and in the contact holes, wherein the first metal silicide layer is formed to prevent silicidation from occurring at the source and drain regions during the second silicidation.

Preferably, carrying out the first silicidation may comprise: depositing a first material on the substrate, and carrying out annealing so that the first material is subjected to silicidation at the source and drain regions to form the first metal silicide layer. And carrying out the second silicidation may comprise: filling poly crystalline silicon in the contact holes; and depositing a second material on the first dielectric layer, and carrying out annealing so that the second material it subjected to silicidation at the gate region and in the contact holes to form the second metal silicide, wherein the annealing temperature in the second silicidation is selected so that the second material does not substantially react with the source and drain regions.

Preferably, the annealing temperature in the second silicidation is not hither than that in the first silicidation.

Preferably, the method may further comprise: forming a cap layer on the gate region before carrying out the first silicidation to prevent the first material from reacting with the gate region; and removing the cap layer before carrying out the second silicidation.

Preferably, depositing the first dielectric layer on the substrate may comprise: depositing the first dielectric layer on the substrate, and then polishing the first dielectric layer by CMP until the cap layer is exposed.

Preferably, filling poly crystalline silicon in the contact holes may comprise: depositing poly crystalline silicon on the substrate, and polishing the poly crystalline silicon by CMP until the cap layer is exposed.

Preferably, the gate region may comprise a gate insulation layer and a poly crystalline silicon layer, and a metal layer sandwiched between the gate insulation layer and the poly crystalline silicon layer.

Preferably, the method may further comprise: after carrying out the second silicidation, forming a second dielectric layer on the first dielectric layer, forming contact holes at the portions corresponding to the gate, and the source and drain regions in the second dielectric layer, and depositing metal in the contact holes to form interconnects.

According to another aspect of the invention, there is provided a semiconductor device, comprising: a semiconductor substrate; a transistor structure including gate, and source and drain regions formed in the semiconductor substrate; a first metal silicide layer formed on the source and drain regions; a first dielectric layer formed on the semiconductor substrate, the top of the first dielectric layer being flush with the top of the gate region; contact holes formed at the portions corresponding to the source and drain regions in the first dielectric layer; and a second metal silicide formed at the gate region and in the contact holes, wherein the first metal silicide layer is formed to prevent silicidation from occurring at the source and drain regions during the second silicidation.

Preferably, the first metal silicide layer may be formed at a first annealing temperature, and the second metal silicide is formed at a second annealing temperature not higher than the first annealing temperature.

Preferably, the gate region may comprise a gate insulation layer, a metal layer and a poly crystalline silicon layer which are formed in this order.

Preferably, the semiconductor device may further comprise: a second dielectric layer formed on the first dielectric layer; contact holes formed at the portions corresponding to the gate, and the source and drain regions in the second dielectric layer; and interconnects formed in the contact holes.

According to the embodiments of the invention, it is possible to reduce the resistivity of the gate by forming the metal silicide in the gate. Further, the first metal silicide layer is formed at the source/drain regions before carrying out silicidation on the gate to prevent further silicidation from occurring at the source/drain regions during the silicidation of the gate, and thus to prevent the silicidation from spreading to the active region. As a result, it is possible to avoid formation of a source of leakage current.

In addition, according to the embodiments of the invention, the first dielectric layer is deposited on the substrate so that the top of the dielectric layer is flush with the top of the gate. The contact holes are formed at the portions corresponding to the source/drain regions in the first dielectric layer, and the metal silicide is also formed in the contact holes. Thus, this is equivalent to such a case in which the source/drain regions are "extended" in height to be flush with the gate. As a result, the contact holes, to be formed at the portions corresponding to the gate and source/drain regions in subsequent processes for fabrication of interconnects, have the same depths, and thus it is easier for the contact holes to be fabricated for example by RIE.

BRIEF DESCRIPTION OF THE DRAWINGS

The above and other objects, features and advantages of the present invention will be apparent for those skilled in the art by reading the following description in conjunction with the attached drawings, wherein.

DETAILED DESCRIPTION OF PREFERRED EMBODIMENTS

Figure 1:
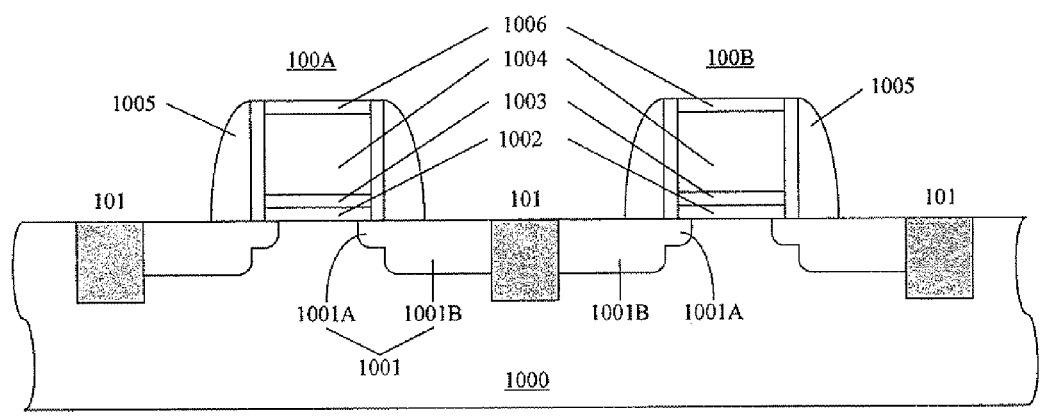
FIGS. 1-10 are structural diagrams showing a semiconductor device according to embodiments of the present invention during respective manufacture phases.

Hereinafter, embodiments of the present invention are described with reference to the drawings.

It is to be noted that the drawings are just provided for illustration rather than limitation. For clarity, the drawings are not plotted to scale, and some of portions and/or regions in the drawings are exaggerated. Further, the portions and/or regions illustrated in the drawings are just ideal examples, and may depart from the illustrated forms due to practical manufacture process or tolerances. For example, corners illustrated as being of a right angle may be of a obtuse angle or a rounded shape in practice. Furthermore, when a layer is described as "on" another layer, it does not exclude the possible situation where there is an intervening layer between the layer and the other layer.

FIG. 1 is a schematic diagram showing a semiconductor structure according to an embodiment of the present invention. As shown in FIG. 1, the semiconductor structure comprises a plurality of transistor structures 100A, 100B, . . . separated by shallow trench isolations (STIs) 101. Though the description is made hereinafter with respect to the plurality of transistor structures formed on a semiconductor substrate, it is to be noted that the present invention also applies to one single transistor structure.

Such a transistor structure may be fabricated, for example, by conventional CMOS process. Specifically, the transistor structure such as 100A or 100B comprises, for example, a substrate 1000 which is n- or p-doped, source/drain regions formed of a lightly doped region 1001A and a heavily doped region 1001B which are n- or p-doped, a gate insulation layer 1002 formed on the semiconductor substrate 1000, and a gate electrode 1004 formed on the gate insulation layer 1002.

Specifically, the above transistor structure may be fabricated, for example, by means of the following process. Firstly, the gate electrode 1004 (for example, poly crystalline silicon) is formed on the gate insulation layer 1002 (for example, SiO2). Then, the lightly doped region 1001A is formed by, for example dopant-implantation, using the gate electrode 1004 as a mask. After that a spacer 1005 is formed on the side walls of the gate electrode 1004. The spacer 1005 may be formed of any suitable dielectric materials, such as $SiO_2$, $SiN_x$ or any combination thereof. And then, the heavily doped region 1001B is formed by dopant-implantation using both the gate electrode 1004 and the spacer 1005 as a mask.

It is to be noted that the above transistor structure may be fabricated in any suitable manners. The method for fabricating the transistor structure is not the key point of the invention, and thus is just described in brief in the specification to illustrate the implementation of the invention. Other alternate processes may be conceived by those skilled in the art to fabricate the transistor structure.

Further, according to an embodiment of the invention, preferably a metal layer 1003 may be additionally formed on the gate insulation electrode 1002 before the gate electrode 1004 is formed thereon. For example, the metal layer 1003 may be formed of TIN, TaN, TiAlN, Ta, or any combination thereof. Preferably, the metal layer 1003 will not react with semiconductor materials such as poly crystalline silicon in the subsequent silicidation process, so that a metal silicide resulting from the subsequent silicidation of the gate electrode 1004 will not contact the gate insulation layer 1002.

According to an embodiment of the invention, after the transistor structures 100A and 1008 shown in FIG. 1 are formed as described above, a cap layer 1006 is deposited on the whole substrate by, for example, chemical vapor deposition (CVD). The cap layer 1006 only remains on the gate electrode 1004 while the source/drain regions 1001 are exposed, for example by etching. The cap layer 1006 may be made of nitride for example, in order to prevent the metal, which is to be deposited for silicidation reaction with the source/drain region, from reacting with the gate electrode 1004. For example, the cap layer 1006 may be made of $SiO_2$, SiN, SiC and the like.

Figure 2:
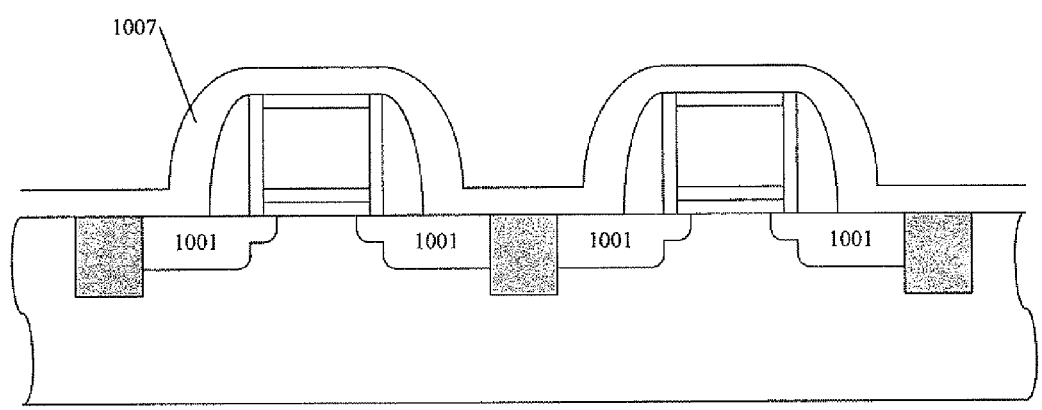
Figure 3:
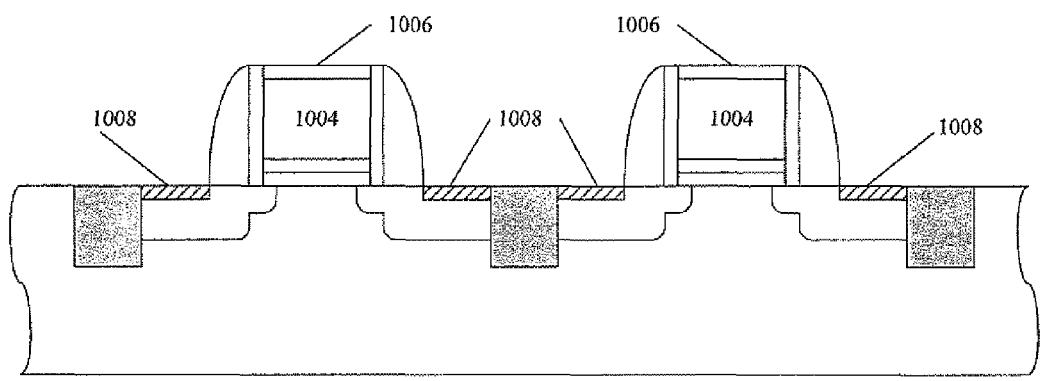

Thereafter, as shown in FIG. 2, a metal layer 1007 is deposited on the substrate. The materials for the metal layer 1007 may comprise Ni, Co, Ti, W and the like. Then, anneal is carried out at a certain temperature so that the deposited metal layer 1007 is subjected to silicidation with the exposed source/drain regions 1001 to form a metal silicide layer 1008. The unreacted metal layer remaining on the substrate, for example the mental layer on the gate electrode, is removed for example by etching. Such etching may be wet etching with phosphoric acid, hydrochloric acid, sulfuric acid or any combination thereof, or other etching. FIG. 3 shows the structure obtained by the above process. It is to be particularly noted that the metal layer 1007 does not react with the poly crystalline silicon of the gate electrode 1004 due to the presence of the cap layer 1006.

In the above embodiment, the cap layer 1006 is used to prevent the metal layer 1007 from reacting with the poly crystalline silicon of the gate electrode 1004. However, there may be other ways to prevent such reaction. For example, instead of depositing the cap layer 1006, it is possible for the metal layer 1007 to only remain on the source/drain region 1001 while the gate region is exposed, for example, by etching. Thus, it is also possible to avoid silicidation at the gate region.

The annealing temperature and time in the silicidation process depend on the type of the metal and the thickness of the metal silicide layer 1008 to be formed. In a word, the mantal silicidation is a phase shift procedure of a metal material. If the temperature is higher than the phase shift temperature of the material, then the phase transition for the material will occur from an original phase to another phase. Materials with different phases have different atom arrangements and properties.

For example, a first phase shift temperature of Ni is about 250° C. If the temperature is higher than 250° C., then Ni will react with Si to form NiSi. Further, there is also a second phase shift temperature for Ni, which is about 700° C. If the temperature is higher than 700° C., NiSi will be converted into $NiSi_2$. Therefore, an annealing temperature of 300-650° C. is usually adopted to form NiSi. For example, it is possible to carry out annealing at a temperature lower than 500° C. for less than 60 seconds.

Furthermore, for example, $CoSi_2$ is usually obtained by a two-stage rapid annealing. In the first-stage annealing, the annealing temperature is about 300-650° C. to form CoSi or $Co_2Si$. And in the second-stage annealing, the annealing temperature is higher than 650° C. to form $CoSi_2$ with low resistivity.

Figure 4:
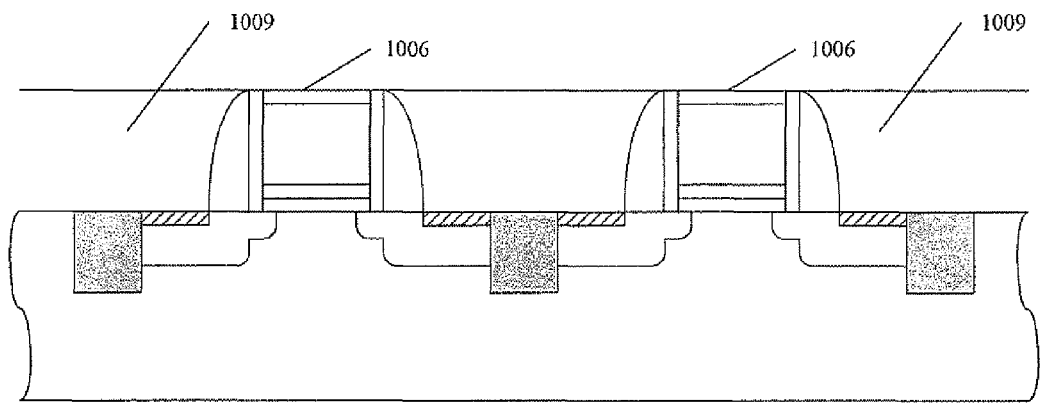

Then, as shown in FIG. 4, a dielectric layer 1009 such as $SiO_2$ is deposited on the substrate. This layer is deposited so that it has a thickness sufficient to bury the protruded gate. After that, the dielectric layer 1009 is polished for example by chemical mechanical polishing (CMP), with the cap layer 1006 serving as a polishing stop layer. In other words, the CMP is continued until the cap layer 106 is exposed. As a result, the top of the dielectric layer 1009 is flush with the top of the gate region.

Figure 5:
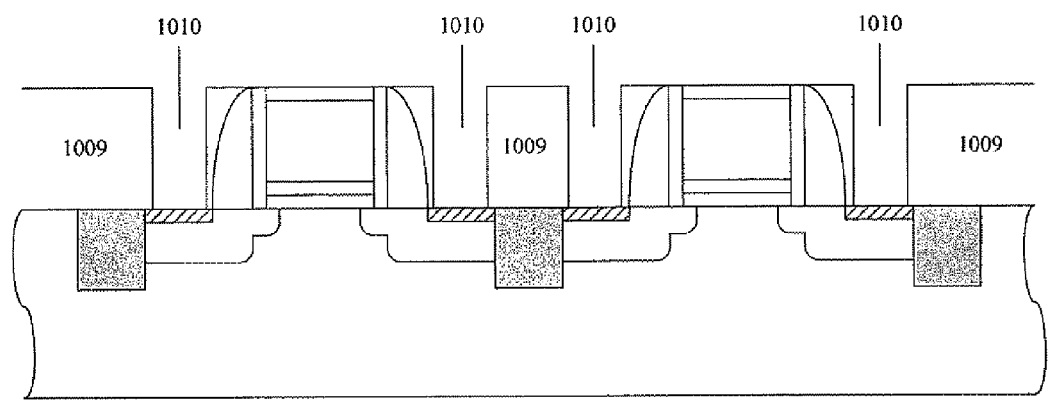

Next, as shown in FIG. 5, the contact holes 1010 for the source/drain regions are formed by punching the portions corresponding to the source/drain regions in the dielectric layer 1009. The punching may be performed for example by reactive ion etching (RIE).

Figure 6:
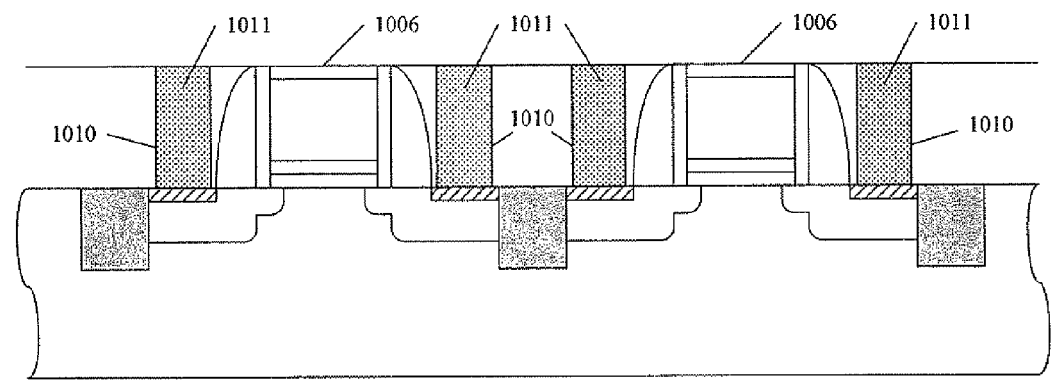

Next, as shown in FIG. 6, the poly crystalline silicon 1011 is filled into the contact holes 1010. Specifically, this may be implemented by the following steps. First, a poly crystalline silicon layer is deposited on the structure to have a thickness sufficient to fully fill the contact holes 1010. And then, the deposited poly crystalline silicon layer is polished by CMP, also with the cap layer 1006 as a polishing stop layer. In other words, the CMP is continued until the cap layer 1006 is exposed.

Figure 7:
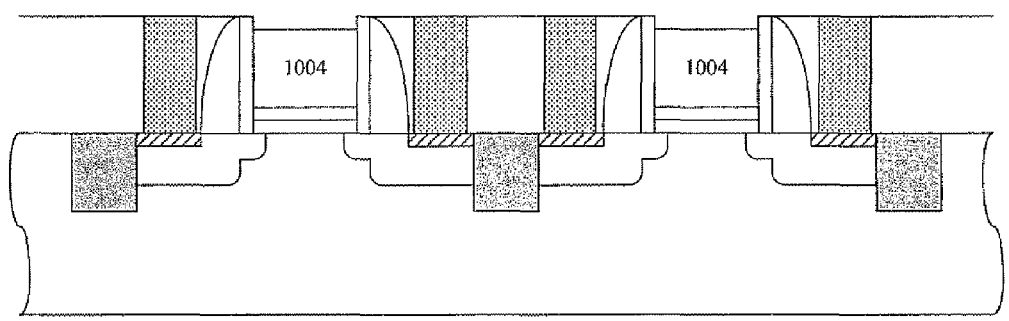

Then, as shown in FIG. 7, the cap layer 1006 is removed to expose the upper surface of the gate electrode 1004. For example, in the case where the cap layer 1006 is made of SiN, it is possible to etch the cap layer 1006 by phosphoric acid. Alternatively, the cap layer 106 may be removed by dry etching, for example, by means of RIE.

Figure 8:
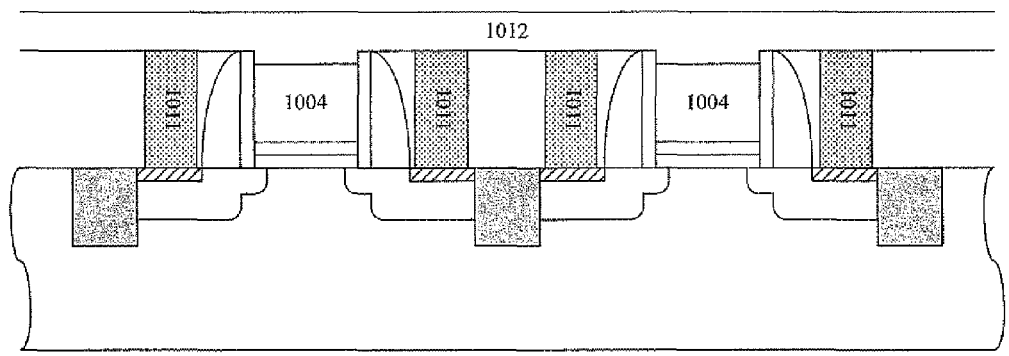

Next, as shown in FIG. 8, a further metal layer 1012 is deposited on the upper surface of the structure shown in FIG. 7, including the exposed upper surface of the gate electrode. Likewise, the materials for the metal layer 1002 may comprise Ni, Co, Ti, W and the like. By means of annealing at a certain temperature, the metal layer 1012 reacts with the poly crystalline silicon of the gate electrode 1004 and the poly crystalline silicon 1011 in the contact holes 1010, so as to form metal silicide 1013 and 1014.

In order to avoid the formation of the source of leakage current due to over-silicidation in the active region, the previously formed metal silicide layer 1008 preferably blocks the current silicidation. In other words, the metal silicide layer 1008 is preferably capable of preventing further silicidation from occurring in the source/drain regions during the current annealing.

Thus, the temperature in the current anneal is preferably not higher than that of the first annealing. As a result, the current annealing will not impact the metal silicide layer 1008 formed in the first annealing, so that the metal silicide layer 1008 prevents the current silicidation from spreading to the active region. For example, the metal silicide layer 1008 may be made of $CoSi_2$, which is formed by the two-stage rapid annealing as described above (with an annealing temperature of 300-650° C. in the first-stage annealing and an annealing temperature higher than 650° C. in the second-stage annealing), and the materials for the metal layer 102 may comprise Ni, which is annealed at about 250° C. to form NiSi with low resistivity. However, it is to be noted that there are various combinations of metal materials and annealing temperatures thereof to achieve the above object. For example, the materials for the metal silicide layer 1008 may comprise NiSi, which is obtained by reaction of Ni with Si at an annealing temperature of about 500° C. Similarly, the metal layer 1012 comprising Ni may be annealed at a temperature of about 400° C. to form NiSi.

Preferably, the metal layer 1012 has a sufficient thickness so that all the poly crystalline silicon of the gate electrode 1004 is converted into metal silicide. In such a case, the poly crystalline silicon 1011 in the contact holes 1010 at the source/drain regions may be also totally converted into silicide. After that, the unreacted metals are removed, and the semiconductor structure according to the embodiment of the invention as shown in FIG. 9 is obtained.

Since the annealing temperature in the second silicidation is not higher than that in the first silicidation, the silicide layer 1008 formed at the source/drain regions is capable of preventing the second silicidation from speading to the active region, and thus avoiding occurrence of the source of leakage current.

Furthermore, the poly crystalline silicon in the contact holes 1010 is totally converted into the silicide 1014, which is equivalent to such a case in which the source/drain regions are "extended" in height to be flush with the gate region. If a dielectric layer is subsequently formed on this device and then contact holes are formed at the portions corresponding to the gate and the source/drain regions in the dielectric layer by means of RIE for example, then all the contact holes have the same depths. As a result, it is possible to simplify the process to form the contact holes.

Figure 9:
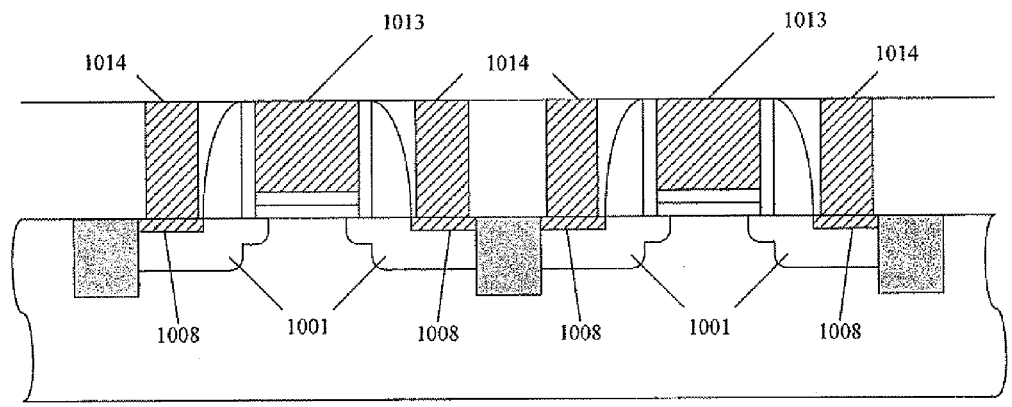
Figure 10:
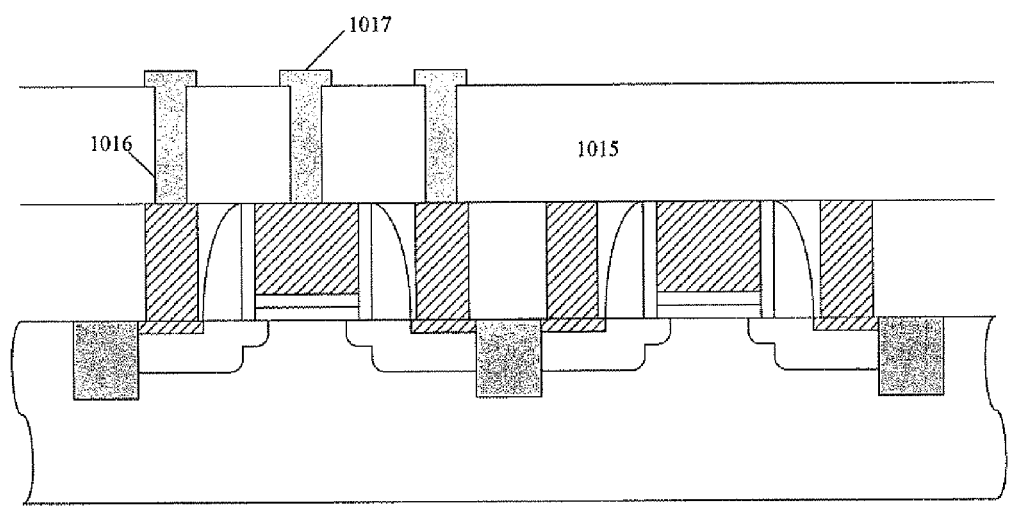

Specifically, referring to FIG. 10, after the structure shown in FIG. 9 is obtained, a dielectric layer 1015 such as SiO$_2$ is deposited thereon. Then, the contact holes 1016 are formed at the portions corresponding to the gate and the source/drain regions in the dielectric layer 1015. For example, the contact holes 1016 may be formed by Next, metal such as Al or Cu is filled into the contact holes 1016 to form interconnects 1017. Since the gate region and the source/drain regions in the structure shown in FIG. 9 have the same height, the contact holes 1016 corresponding to the respective regions also have the same the depths. Thus, it is easy to control the etching conditions in RIE to form the contact holes. Although the contact holes 1016 and the interconnects 1017 are illustrated with respect to only one transistor structure herein, the above arrangement also applies to other transistor structures.

The above manufacture process applies to various types of semiconductor devices, and especially to sub-micron complementary metal oxide semiconductor (CMOS) devices. According to embodiments of the invention, the subsequent silicidation on the gate after the formation of the silicide layer 1008 at the source/drain regions will not impact the active region, and the reliability of the device is thereby improved. Furthermore, according to the preferred embodiment of the invention, full silicidation is achieved in the gate, so that the resistance of the gate electrode is substantially reduced. In addition, it is possible to simplify subsequent process by forming silicide 1014 at the source/drain regions.

It is to be noted that the foregoing embodiments are illustrative only and should not be considered as limiting the present invention. It will be understood by those skilled in the art that various changes and alternatives may be made without departing from the spirit and scope of the present invention defined by the appended claims.

What is claimed is:

1. A method of fabricating a semiconductor device, comprising:
    forming a transistor structure including a gate, and source and drain regions on a semiconductor substrate;
    carrying out a first silicidation to form a first metal silicide layer on the source and drain regions;
    depositing a first dielectric layer on the substrate, the top of the first dielectric layer being flush with the top of the gate;
    forming contact holes at the portions corresponding to the source and drain regions in the first dielectric layer; and
    carrying out a second silicidation to form a second metal silicide into the gate and in the contact holes,
    wherein the first metal silicide layer is formed to prevent silicidation from occurring at the source and drain regions during the second silicidation.

2. The method according to claim 1, wherein
    carrying out the first silicidation comprises:
        depositing a first material on the substrate, and carrying out annealing so that the first material is subjected to silicidation at the source and drain regions to form the first metal silicide layer; and
    carrying out the second silicidation comprises:
        filling poly crystalline silicon or amorphous silicon in the contact holes; and
    depositing a second material on the first dielectric layer, and carrying out annealing so that the second material is subjected to silicidation in the gate and in the contact holes to form the second metal silicide,
    wherein the annealing temperature in the second silicidation is selected so that the second material does not substantially react with the source and drain regions.

3. The method according to claim 2, wherein the annealing temperature in the second silicidation is not higher than that in the first silicidation.

4. The method according to claim 2, further comprising:
    forming a cap layer on the gate before carrying out the first silicidation to prevent the first material from reacting with the gate; and
    removing the cap layer before carrying out the second silicidation.

5. The method according to claim 4, wherein depositing the first dielectric layer on the substrate comprises:
    depositing the first dielectric layer on the substrate, and then polishing the first dielectric layer by CMP until the cap layer is exposed.

6. The method according to claim 4, wherein filling poly crystalline silicon or amorphous silicon in the contact holes comprises:
    depositing poly crystalline silicon on the substrate, and polishing the poly crystalline silicon by CMP until the cap layer is exposed.

7. The method according to claim 1, wherein the gate comprises a gate insulation layer and a poly crystalline silicon layer, and a metal layer sandwiched between the gate insulation layer and the poly crystalline silicon layer.

8. The method according to claim 1, further comprising:
    after carrying out the second silicidation, forming a second dielectric layer on the first dielectric layer, forming contact holes at the portions corresponding to the gate, and the source and drain regions in the second dielectric layer, and depositing metal in the contact holes to form interconnects.

* * * * *